(12) United States Patent
Enders et al.

(10) Patent No.: US 6,992,345 B2
(45) Date of Patent: Jan. 31, 2006

(54) INTEGRATED SEMICONDUCTOR MEMORY WITH A SELECTION TRANSISTOR FORMED AT A RIDGE

(75) Inventors: Gerhard Enders, Olching (DE); Andreas Spitzer, Ottobrunn (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/727,595

(22) Filed: Dec. 5, 2003

(65) Prior Publication Data

US 2004/0136227 A1 Jul. 15, 2004

(30) Foreign Application Priority Data

Dec. 5, 2002 (DE) ................. 102 56 973

(51) Int. Cl.
*H01L 27/108* (2006.01)
(52) U.S. Cl. ..................... 257/301; 257/368
(58) Field of Classification Search ........... 257/301, 257/368, 327; 438/243, 386
See application file for complete search history.

(56) References Cited

U.S. PATENT DOCUMENTS 5,504,027 A 4/1996 Jeong et al.
6,242,772 B1 * 6/2001 Wahlstrom ............... 257/309
6,472,702 B1 10/2002 Shen
2003/0178662 A1 * 9/2003 Voigt et al. ............... 257/301

FOREIGN PATENT DOCUMENTS

DE 36 40363 A1 8/1987
EP 0 703 625 A2 3/1996

OTHER PUBLICATIONS

Yang-Kyu Choi et al., Sub-20nm CMOS FinFet Technologies, Department of Electrical Engineering and Computer Sciences, University of California, Berkeley, CA 94720, 2001, 4 pages.

* cited by examiner

Primary Examiner—Douglas W. Owens
(74) Attorney, Agent, or Firm—Edell, Shapiro & Finnan, LLC

(57) ABSTRACT

An integrated semiconductor memory is disclosed having selection transistors which can be formed at a respective ridge. The ridge can be arranged on an insulation layer. In the ridge the first source/drain region can be formed at one lateral end of the ridge and the second source/drain region can be formed at another lateral end of the ridge. The longitudinal sides of the ridge and a top side of the ridge can be covered with a layer stack including a gate dielectric and a gate electrode. High write-read currents can be achieved in the on state of the selection transistors and leakage currents occurring in the off state can be reduced.

18 Claims, 3 Drawing Sheets

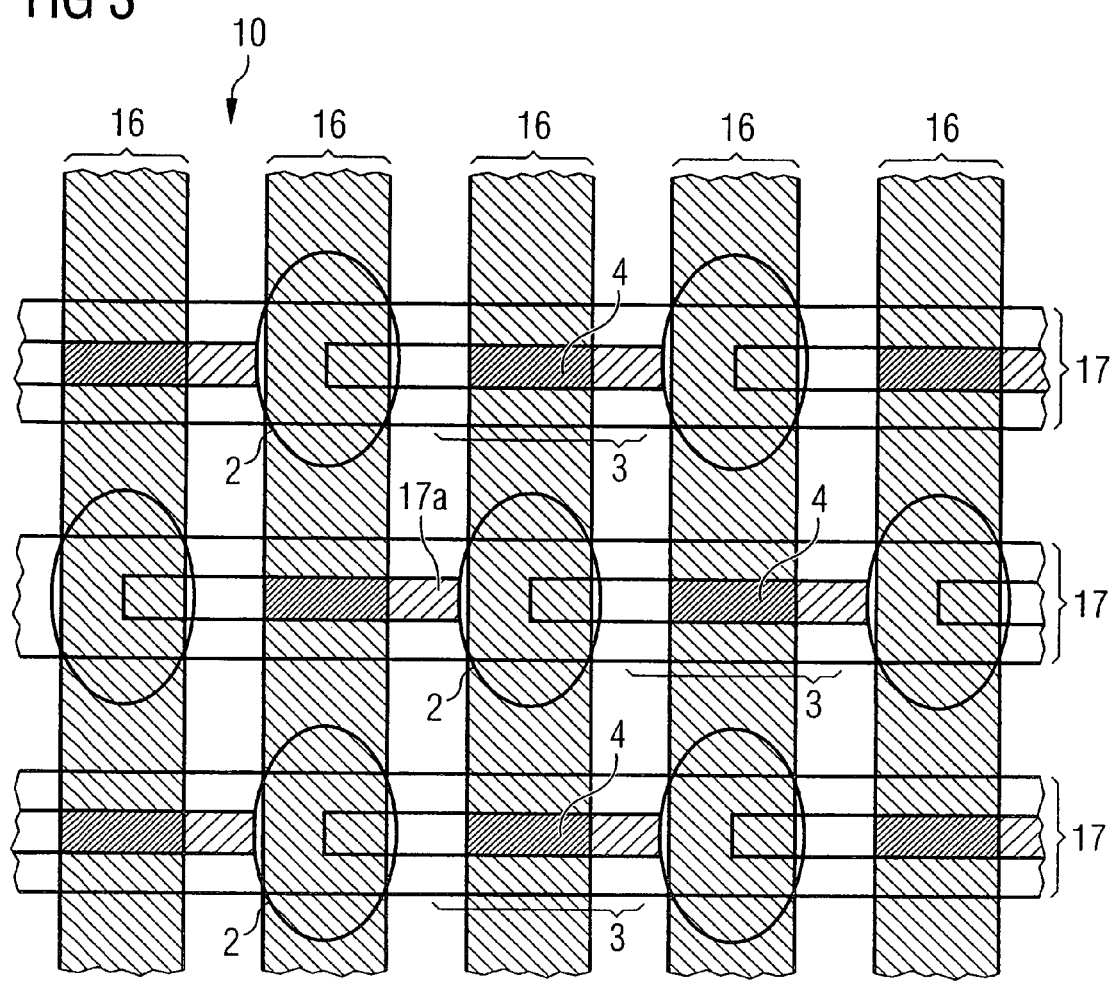

INTEGRATED SEMICONDUCTOR MEMORY WITH A SELECTION TRANSISTOR FORMED AT A RIDGE

CROSS REFERENCE TO RELATED APPLICATIONS

This application claims priority under 35 USC § 119 to German Application No. 10256973.8, filed on Dec. 5, 2002, and titled "Integrated Semiconductor Memory With A Selection Transistor Formed at a Ridge," the entire contents of which are hereby incorporated by reference.

FIELD OF THE INVENTION

The invention relates to an integrated semiconductor memory, and more particularly, an integrated semiconductor memory with a memory cell having a storage capacitor and a selection transistor.

BACKGROUND

Integrated semiconductor memories have a memory cell array with a multiplicity of memory cells for storing digital information and also a logic area for driving the memory cell array and for operating the semiconductor memory. Storage is effected in storage capacitors, which are driven via a selection transistor situated at the crossover point between a word line, which electrically opens or closes the transistor, and a bit line. Further transistors are arranged in the logic area, and are formed differently and dimensioned differently than selection transistors of memory cells. In particular, the tradeoff between the requirement to minimize space in the memory area on the wafer and the desired analog switching behavior of transistors of the logic area yield different selection criteria for the design of the transistors for the memory and logic areas, respectively.

One design of the selection transistor in the memory area is the surrounding gate transistor. Ridges made of substrate material formed by a vertical anisotropic etching are used as a basic structure for the formation of the transistor. In this case, the patterned, usually elongate, ridge is covered with a gate dielectric and surrounded from all sides, except for the top side, with a surrounding gate electrode formed by a spacer technique. A trench capacitor is arranged at one end of the ridge. A first, lower source/drain region is formed by outdiffusion from the inner capacitor electrode of the trench capacitor. On the top side of the ridge, a second, upper source/drain is formed by implantation. In this way a vertical selection transistor is produced in the ridge above the trench capacitor. Alternatively, the vertical selection transistors can be formed in the interior of a capacitor trench above the storage capacitor.

Furthermore, there are semiconductor memories with planar selection transistors in the memory cell array, which are arranged laterally with respect to the connected storage capacitors. These selection transistors do not have a ridge made of substrate material.

These designs of selection transistors are usually realized using field-effect transistors, in particular, MOSFETs (metal oxide semiconductor field effect transistors), in which, between two source/drain regions below a gate dielectric, an electrically conductive channel is formed by inversion of doped substrate material. The inversion channel has a channel length between the source and the drain, and a channel width, which corresponds to the optical resolution limit used.

In view of decreasing operating voltages and decreasing lateral dimensions of the memory cells with limited current density, the write and read speed cannot be increased sufficiently to the desired extent.

Moreover, leakage currents, which flow, for example, via the electrical connection between storage capacitor and selection transistor, cause a an early discharge of the storage capacitor which, in the case of dynamic semiconductor memories, shortens the refresh period and increases the current consumption of the memory.

SUMMARY

It is an object of the invention to provide an integrated semiconductor memory which can be operated with a higher current for writing in and/or reading out information and which can be less susceptible to leakage currents. Generally, an integrated semiconductor memory includes a ridge arranged on an insulation layer, a first source/drain region arranged on the insulation layer at one lateral end of the ridge, and a second source/drain region is arranged on the insulation layer at another lateral end of the ridge. Also, the two longitudinal sides of the ridge and a top side of the ridge can be covered with a stack of layers comprising a gate dielectric and a gate electrode.

A memory cell in a memory cell array can include a transistor in which the transistor channel's current flow direction can be parallel to the insulation layer. The transistor can be provided at a ridge made of substrate material. The current flow direction can also be parallel to the longitudinal direction of the ridge. Both longitudinal sides and the top side of the ridge can be covered by a gate dielectric. A gate electrode can be arranged above the gate dielectric. This results in a significantly larger channel width than in conventional selection transistors, since twice the height of the ridge (in each case at the left-hand and right-hand longitudinal side of the ridge) and the width of the ridge together form the channel width. Consequently, by large ridge heights, without enlarging the basic area of the memory cell, it is possible to achieve high channel widths, i.e., high currents for storing and reading out information, as a result of which the write and read speed of the semiconductor memory can increase.

At the same time, the eventual leakage currents in the off state of the transistor, i.e., when no channel is formed, can be reduced, since the transistor and its conductive connection to the storage capacitor can be isolated from the semiconductor substrate by the buried insulation layer. As a result, a more reliable insulation can be achieved than when lower source/drain contacts are formed by outdiffusion of the surrounding gate transistors, in which the conductive connection between selection transistor and storage capacitor is formed by a dopant diffusion extending into the semiconductor material.

In the semiconductor memory according to the invention, the selection transistor formed at the ridge is situated above the buried insulation layer. The insulation layer can be an oxide layer. The selection transistor is insulated from adjacent memory cells by the buried insulation layer. Shallow trench isolations and also collar regions are thus not necessary any longer.

Consequently, conflicting design requirements of the transistor can be better reconciled than for a conventional semiconductor memory.

The storage capacitor can be a trench capacitor whose inner capacitor electrode can be isolated from an outer capacitor electrode below the buried insulation layer by a capacitor dielectric. The capacitor dielectric extends to the bottom of the storage capacitor. In conventional trench capacitors, a collar region is provided in an upper portion of the trench to prevent the formation of parasitic transistors The collar leads to constrictions for the inner capacitor electrode. The upper portion of the inner capacitor electrode is isolated from the outer capacitor electrode, which is formed by the semiconductor material of the substrate, by the capacitor dielectric as well as by the collar region. The collar does not extend to the bottom of the capacitor. The storage capacitor can only be produced below a certain depth which is below the depth of the collar region.

In the case of the invention without a collar region, the storage capacitor extends up to the buried insulation layer which is arranged directly below the ridge. As a result of which the capacitance is increased.

The inner capacitor electrode of the storage capacitor can extend up to the bottom side of the buried insulation layer and can be connected by a surface contact to the first source/drain region of the selection transistor. The surface contact can be situated at the level of and above the buried insulation layer, and can be electrically insulated by the latter from the substrate material situated at a deeper level. Consequently, leakage currents between the storage capacitor and the selection transistor rarely occur in this region.

The top side of the surface contact can be arranged below the level of the top side of the ridge and cab be electrically insulated from a word line passing the storage capacitor by an insulating upper filling structure. This word line (passing word line) can be formed at the same level as the word line, which can be connected to the selection transistor and can cover the top side of the ridge. The passing word line running at the same level can be insulated from the top side of the recessed surface contact by the upper filling structure.

The semiconductor substrate can be doped below the buried insulation layer. The use of an SOI substrate (silicon on insulator) together with the selection transistor designs provides for good insulation of the current path between a selection transistor and the storage capacitor connected thereto from adjacent memory cells and also from the semiconductor substrate below the buried insulation layer.

The second source/drain region can have, in the longitudinal direction of the ridge, the same dimension, i.e., the same width, as the bottom side of a spacer of a word line which covers the ridge. The second source/drain region can be connected to a bit line contact on the end side of the ridge remote from the capacitor. Consequently, one of the source/drain regions can be patterned using the word line spacer. That end side of the second source/drain region which is remote from the capacitor may be connected by a bit line contact 17a to a bit line running above the ridge and above the word line.

Accordingly, a bit line can be arranged above the ridge, can run parallel to the longitudinal direction of the ridge, and can be connected to the second source/drain region. By this bit line, ridges, which are arranged along their longitudinal direction adjacent to one another and separated by capacitor trenches, can be connected. The contact is made through a bit line contact disposed at a respective end of the ridge. In the direction of the word lines adjacent to the ridges and at a level below the bit lines, provided that no word lines run there, the memory cell array can be filled with an insulating material, for example, an oxide or nitride.

A word line can run perpendicular to the longitudinal direction of the ridge, and can cover the gate dielectric on both longitudinal sides and on the top side of the ridge. The gate electrode that is formed by the word line and is isolated from the semiconductor material of the ridge only by the gate oxide layer at both side walls of the ridge which run in the longitudinal direction, leads to a channel width which is only limited by the height of the ridge. The channel width can thus be chosen to be larger than the feature size (critical dimension), i.e., the optical resolution limit used in the lithographic patterning. The ridge may be patterned in a manner narrower than the optical resolution limit. For example, it may be narrower than the bit line running above it. The channel width is not adversely effected thereby, since essentially the ridge height contributes to the channel width.

The semiconductor memory can have a multiplicity of memory cells of the semiconductor memory with selection transistors formed at ridges, a bit line contact being arranged only at every second crossover point between a bit line and a word line and a word line passing above or below a storage capacitor at the remaining crossover points. The selection transistors formed at the ridges can thus be arranged relative to the direction of the word lines and bit lines in a diagonal grid of selection transistors that are disposed adjacent to one another.

The integrated semiconductor memory can be a dynamic read-write memory, in particular, a DRAM (dynamic random access memory).

The details of one or more embodiments are set forth in the accompanying drawings and the description below. Other features will be apparent from the description and drawings and from the claims.

BRIEF DESCRIPTION OF FIGURES

FIG. 3 is a plan view of the semiconductor memory of FIG. 1.

Like reference symbols in the various drawings indicate like elements.

DETAILED DESCRIPTION

Figure 1:
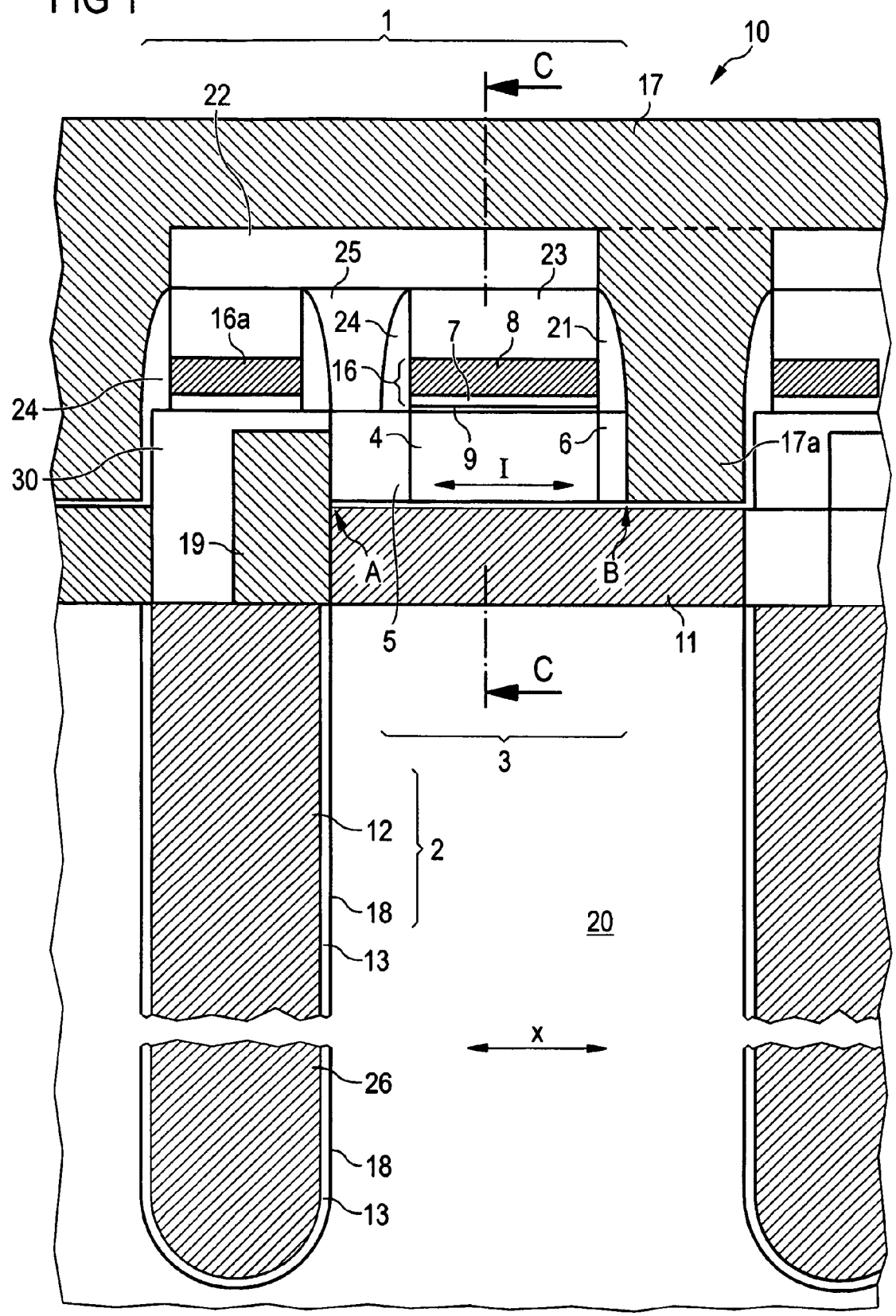
FIG. 1 is a cross-sectional view of a semiconductor memory according to the invention.

FIG. 1 shows an integrated semiconductor memory 10 with an SOI substrate 20. The buried insulation layer 11 can be arranged directly below the selection transistors 3 of the memory cells 1. The selection transistors can be formed at ridges 4. The buried insulation layer, preferably oxide layer 11, can have openings in which a trench capacitor 2 can be incorporated into the substrate 20. The trench can be connected to a first source/drain region 5 of the selection transistor 3 by a contact arranged in the opening, a surface contact 19. The first source/drain region 5 can be situated at a first end A of the ridge 4 running in the longitudinal direction x, and the second source/drain region 6 can be arranged at the other lateral end B of the ridge. The ridge can extend between the ends A, B with its main extending direction x, which can coincide with the current flow direction I of the transistor channel. The ridge can be surrounded from above and also on its side walls above and below the plane of the drawing by a gate oxide 9 and a gate layer stack 16.

In contrast to conventional storage capacitors, the storage capacitor 2 does not have a collar region. Instead, the inner capacitor electrode 12 can be isolated from an outer capacitor electrode 18, in a depth directly below the insulation layer 11, only by a capacitor dielectric 13, which can extend to the bottom 26 of the storage capacitor.

Figure 2:
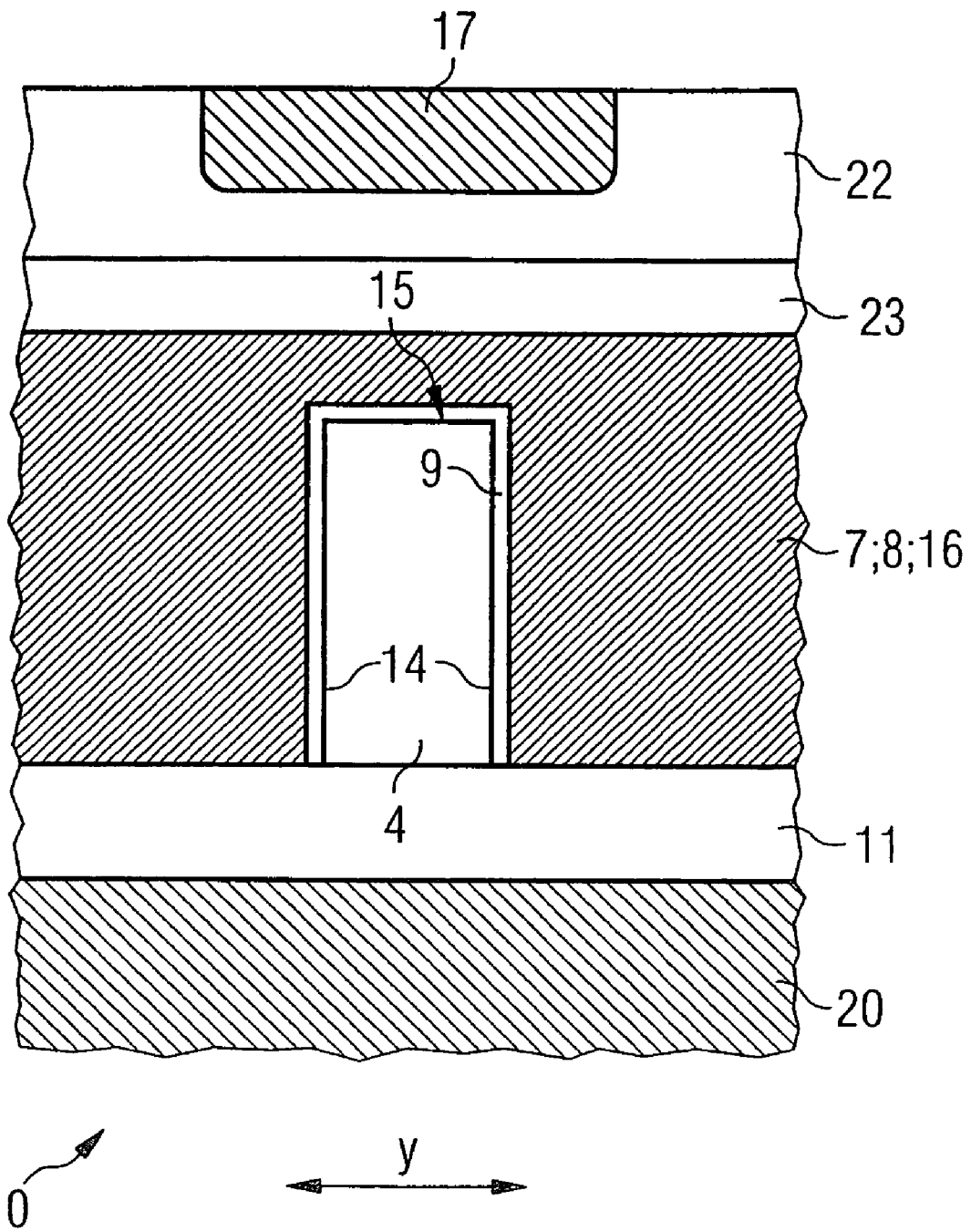
FIG. 2 is another cross-sectional view, taken along the line C—C in FIG. 1.

FIG. 2 is a cross-sectional view, taken along the line C—C of FIG. 1, i.e., perpendicular to the plane of the drawing of FIG. 1. In FIG. 2, the transistor channel runs perpendicularly to the plane of the drawing through the ridge, along the two side areas 14 and along the top side 15. There, the gate layer stack 16, can be composed, for example, of a lower gate layer 7, for instance, made of polysilicon, and an upper gate layer, which may contain tungsten, can be isolated from the channel region of the ridge 4 only by the gate oxide 9 or some other dielectric.

The dimensions in FIG. 2 are not illustrated to scale. The height of the ridge can be greater than the optical resolution limit used in the lithographic exposure during the fabrication of the semiconductor memory. In particular, the ridge height and thus the height of the side areas 14 may be greater than the distance between the bit lines 17, thus resulting in a larger channel width than in the case of a conventional selection transistor. In FIG. 2, the oxide layer 11 can be arranged below the ridge and the bulk material of the substrate 20, which can be doped, in particular, heavily n-doped, can be arranged below the oxide layer. Alternatively, the doping of the ridge 4 can be adapted to the desired electrical properties of the selection transistor. In particular, the semiconductor material of the ridge 4 can be doped with a different doping type, a different dopant and/or a different dopant concentration than the semiconductor material 20 below the buried oxide layer 11. In FIG. 2, the bit line 17 can be insulated from the word line 16 by an oxide layer 22 or a different dielectric.

The ridge 4, illustrated in cross section perpendicular to the current direction in FIG. 2, can run from right to left between the first and second source/drain regions 5, 6 in FIG. 1. The surface contact 19 can have a top side arranged at a deeper level than the top side 15 of the ridge 4 and may therefore be covered by an insulating filling structure 30, for example, an oxide, before a passing word line 1 6a can be deposited above the capacitor trench. An insulation layer 22 can be deposited in order to insulate the word lines from the bit lines.

The storage capacitor 2 can have as outer capacitor electrode, either an electrode (buried plate) which can be arranged below the buried insulation layer 11 and can be arranged in the bulk material, or can include the doped, for example, heavily n-doped, substrate material of the semiconductor substrate 20. The inner capacitor electrode 12 can be isolated along the entire length of the electrode from the substrate 20 by a capacitor dielectric 13, which may be a layer stack. The electrical connection between the inner capacitor electrode 12 and the first source/drain region 5 of the selection transistor 3 is achieved by a surface contact 19.

The surface contact 19 and the selection transistor 3 can be insulated from the semiconductor material of the semiconductor substrate 20 by the buried insulation layer 11, so that leakage currents can be smaller in this region than in conventional semiconductor memories.

FIG. 3 shows, in plan view, an arrangement of seven storage capacitors 2, which are connected toward the right-hand side to a respective selection transistor 3 formed in each case at a ridge 4. The storage capacitors 2 can be arranged below the buried insulation layer 11, whereas the selection transistors 3 can be arranged above the buried insulation layer 11. The word lines 16 can cross the longitudinal direction x of the ridges 4 and can cover both longitudinal sides and the top side of the ridges. As a result, a large channel width can be obtained. By using narrow ridges which may be configured narrower in direction y, with the aid of spacers, than the distance between the bit lines 17, charge carriers in the semiconductor material of the ridge can be completely depleted, so that an ideal on/off current characteristic of the selection transistor 3 can be achieved. The subthreshold transconductance of such a transistor can be higher than a conventional transistor. A higher current can be achieved with a significantly reduced voltage at the gate. This affords advantages over conventional memory types, for instance, a higher current consumption and a smaller area taken by the circuits.

In FIG. 3, the ridges can be arranged in rows along the bit lines 17 running above them. Adjacent ridges 4 in direction y of the word lines 16 can be offset with respect to one another in the x direction, so that such adjacent memory cells can be driven by two different word lines 16 and can be connected to two different bit lines 17.

During fabrication of the semiconductor memory, an SOI substrate, which may be doped below its oxide layer 11, can be covered with a layer stack for etching a mask for the patterning of capacitor trenches. Such a layer stack may, for instance, include an oxide, a nitride, a borosilicate glass, or a polysilicon.

The photolithographic patterning of the mask and etching of the capacitor trenches can be followed by the deposition of the capacitor dielectric (for instance, a nitride, oxide, an aluminum oxide, etc.) and, on the latter, the inner capacitor electrode can be made, for example, of heavily n-doped polysilicon. The material of the inner capacitor electrode can be etched back at most to the lower edge of the buried insulation layer 11 of the semiconductor substrate 20. The capacitor dielectric 13 can then be removed at the level of the ridge.

A polysilicon layer can be deposited and subsequently etched back approximately to the level of the top side of the ridge or a little deeper. Half of each surface contact 19 can be removed in the direction of its nearest left-hand ridge 4. The resulting opening can be filled with an insulating material, for instance, an oxide 30, which can also cover the top side of the surface contact 19.

Afterward, a hard mask for patterning the ridges can be patterned lithographically. In order to fabricate particularly fine hard mask structures for patterning the ridges, a spacer can be used as mask. As a result, ridge widths in the y direction can be narrower than the lithographic resolution limit, which can be used for patterning the word lines and the bit lines. After etching of the surroundings of the ridges, the etching mask can be removed, doping of the channel region can be introduced by implantation into the semiconductor material of the ridge, and a gate oxide layer can be grown.

Polysilicon can be deposited as first gate layer 7 onto the gate oxide layer and can be subject to chemical mechanical polishing in order to deposit a second gate layer 8 made of tungsten, for example, thereabove on top of layer 7 and a covering layer made of nitride 23. Subsequently, the word line layer stack can be patterned lithographically. This patterning can include a nitride etching, a resist removal, a tungsten etching, an etching of polysilicon, and side wall oxidation of the word line.

Afterward, a nitride or a different spacer material can be deposited and can be etched back anisotropically, thereby providing spacers 21, 24. Then, the second source/drain regions can be implanted and can be covered by an oxinitride deposition and a deposition of BPSG (borophosphosilicate glass), which can flow thermally. After the BPSG filling has been polished back to the top side of the nitride 23 covering the word lines, an undoped oxide can be deposited and can be patterned lithographically in order to fabricate bit line contact holes for making contact with the second source/drain regions 6, an oxide etching, an oxinitride etching and a silicon etching succeeding one another.

Finally, a metal can be deposited for fabricating the bit line contacts 17a and the bit lines themselves. In this way, a selection transistor with a transistor channel having a horizontal current direction can be fabricated at the ridges in the memory cell array. This selection transistor, in the on state, can enable a high write and read current to the storage capacitor 2 and, in the off state, can be insulated from the material of the semiconductor substrate 20 by the buried insulation layer 11.

An integrated semiconductor memory fabricated in this way can include storage capacitors 2, which can extend closer to the surface of the semiconductor substrate, and therefore, can have a slightly larger capacitance than conventional storage capacitors. The storage capacitor may likewise be a stacked capacitor. In particular, a capacitor can be arranged above word lines. In this case, there is no electrical connection between the substrate material and the memory cell. A memory cell can have a semiconductor memory with an area of 8 $F^2$, where F corresponds to the optical resolution limit or typical structure width of structures produced lithographically.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Memory cell
2 Storage capacitor
3 Selection transistor
4 Ridge
5 First source/drain region
6 Second source/drain region
7 Lower gate layer
8 Upper gate layer
9 Gate dielectric
10 Integrated semiconductor memory
11 Buried insulation layer
12 Inner capacitor electrode
13 Capacitor dielectric
14 Longitudinal side of a ridge
15 Top side of a ridge
16 Gate electrode
17 Bit line
18 Inner wall of a storage capacitor
19 Surface contact
20 Semiconductor substrate
21 Spacer
22 Oxide layer
23 Nitride layer
24 Further spacer
25 Insulating filling
26 Bottom of the storage capacitor
30 Insulating filling structure
A, B Lateral ridge ends
I Current flow direction of the transistor channel

What is claimed is:

1. An integrated semiconductor memory with a memory cell, comprising:
   a storage capacitor; and
   a selection transistor, the selection transistor being formed at a ridge made of semiconductor material, having a first and a second source/drain region, and at least one gate layer, the ridge being arranged on an insulation layer, the first source/drain region being arranged on the insulation layer at one lateral end of the ridge, the second source/drain region being arranged on the insulation layer at another lateral end of the ridge, the ridge having two longitudinal sides and a top side, the two longitudinal sides of the ridge and the top side of the ridge being covered with a layer stack, the layer stack including a gate dielectric and a gate electrode.

2. The semiconductor memory as claimed in claim 1, wherein the storage capacitor is a trench capacitor, the trench capacitor having an inner capacitor electrode and an outer capacitor electrode, the inner capacitor electrode being isolated from the outer capacitor electrode by a capacitor dielectric, the trench capacitor being disposed below the insulation layer, the capacitor dielectric extending to the bottom of the storage capacitor.

3. The semiconductor memory as claimed in claim 2, wherein the inner capacitor electrode of the storage capacitor extends to a bottom side of the insulation layer and is connected by a surface contact to the first source/drain region of the selection transistor.

4. The semiconductor memory as claimed in claim 3, wherein atop side of the surface contact for the inner capacitor electrode is arranged below a level of the top side of the ridge and is electrically insulated from a word line passing the storage capacitor by an insulating upper filling structure.

5. The semiconductor memory as claimed in claim 2, wherein the inner capacitor electrode of the storage capacitor extends to a bottom side of the insulation layer and is connected by a surface contact to the first source/drain region of the selection transistor.

6. The semiconductor memory as claimed in claim 5, wherein a top side of the surface contact for the inner capacitor electrode is arranged below a level of the top side of the ridge and is electrically insulated from a word line passing the storage capacitor by an insulating upper filling structure.

7. The semiconductor memory as claimed in claim 1, wherein a doped semiconductor substrate is below the insulation layer.

8. The semiconductor memory as claimed in claim 2, wherein a doped semiconductor substrate is disposed below the insulation layer.

9. The semiconductor memory as claimed in claim 1, wherein the second source/drain region has, in a longitudinal direction of the ridge, the same dimension as a bottom side of a spacer of a word line covering the ridge, and wherein the second source/drain region is connected to a bit line contact on an end side of the ridge which is remote from the capacitor.

10. The semiconductor memory as claimed in claim 9, wherein a bit line is arranged above the ridge, the bit line running parallel to a longitudinal direction of the ridge and being connected to the second source/drain region.

11. The semiconductor memory as claimed in claim 1, wherein a bit line is arranged above the ridge, the bit line running parallel to a longitudinal direction of the ridge and being connected to the second source/drain region.

12. The semiconductor memory as claimed in claim 1, wherein a word line runs perpendicular to a longitudinal direction of the, the word line covering the gate dielectric on both longitudinal sides and on the top side of the ridge.

13. The semiconductor memory as claimed in claim 1, wherein the semiconductor memory has a plurality of memory cells having selection transistors formed at ridges, a bit line contact is arranged adjacent to a first predetermined crossover point between a bit line and a word line, and a word line passes above a storage capacitor at a second predetermined crossover points.

14. The semiconductor memory as claimed in claim 13, wherein the first predetermined crossover points are every second crossover point.

15. The semiconductor memory as claimed in claim 14, wherein the second predetermined crossover points are the remaining crossover points.

16. The semiconductor memory as claimed in claim 13, wherein the second predetermined crossover points are the remaining crossover points.

17. The semiconductor memory as claimed in claim 1, wherein the semiconductor memory has a plurality of memory cells with selection transistors formed at ridges, a bit line contact is arranged adjacent to a first predetermined crossover point between a bit line and a word line, and a word line passes below a storage capacitor at a second predetermined crossover points.

18. The semiconductor memory as claimed in claim 1, wherein the integrated semiconductor memory is a dynamic read-write memory.

* * * * *